US009414498B2

(12) United States Patent
Hua et al.

(10) Patent No.: US 9,414,498 B2
(45) Date of Patent: Aug. 9, 2016

(54) VIA-HOLE DRILLING IN A PRINTED CIRCUIT BOARD USING A CARBON MONOXIDE LASER

(71) Applicant: Coherent, Inc., Santa Clara, CA (US)

(72) Inventors: Gongxue Hua, Unionville, CT (US); Eric R. Mueller, West Suffield, CT (US)

(73) Assignee: Coherent, Inc., Santa Clara, CA (US)

( * ) Notice: Subject to any disclaimer, the term of this patent is extended or adjusted under 35 U.S.C. 154(b) by 268 days.

(21) Appl. No.: 14/033,246

(22) Filed: Sep. 20, 2013

(65) Prior Publication Data
US 2015/0083698 A1 Mar. 26, 2015

(51) Int. Cl.
B23K 26/00 (2014.01)
B23K 26/16 (2006.01)
H05K 3/00 (2006.01)
B23K 26/38 (2014.01)
B23K 26/06 (2014.01)
B23K 26/40 (2014.01)

(52) U.S. Cl.
CPC .......... *H05K 3/0026* (2013.01); *B23K 26/0622* (2015.10); *B23K 26/0643* (2013.01); *B23K 26/0652* (2013.01); *B23K 26/38* (2013.01); *B23K 26/382* (2015.10); *B23K 26/40* (2013.01); *B23K 26/704* (2015.10); *B23K 2201/42* (2013.01); *B23K 2203/50* (2015.10)

(58) Field of Classification Search
CPC ............ B23K 2201/42; B23K 26/06–26/0652; B23K 26/38; B23K 26/381; B23K 26/4075; H05K 3/0026

USPC .......................................... 219/121.6–121.83
See application file for complete search history.

(56) References Cited

U.S. PATENT DOCUMENTS

| | | | | |
|---|---|---|---|---|
| 3,935,419 A | * | 1/1976 | Lambert et al. ........... | 219/121.67 |
| 6,052,216 A | * | 4/2000 | Rolfe et al. .................... | 359/285 |
| 6,576,869 B1 | | 6/2003 | Gower et al. | |
| 6,618,070 B2 | * | 9/2003 | Fischer et al. ................ | 347/239 |
| 6,784,399 B2 | | 8/2004 | Dunsky et al. | |
| 6,826,204 B2 | | 11/2004 | Kennedy et al. | |
| 7,039,079 B2 | | 5/2006 | Seguin et al. | |
| 7,058,093 B2 | | 6/2006 | Kennedy et al. | |
| 7,375,819 B2 | | 5/2008 | Courville et al. | |

(Continued)

FOREIGN PATENT DOCUMENTS

GB 2338201 A 12/1999

OTHER PUBLICATIONS

Chang et al., "Design of a Double-Pass Shear Mode Acousto-Optic Modulator", Review of Scientific Instruments, vol. 79, 033104, 2008, pp. 033104-1-033104-5.

(Continued)

*Primary Examiner* — Sang Y Paik
(74) *Attorney, Agent, or Firm* — Morrison & Foerster LLP

(57) ABSTRACT

Apparatus for drilling a via-hole in a printed circuit board (PCB) includes a carbon monoxide laser deliver laser radiation pulses. The pulses have a relatively broad wavelength-range, and slow rising and falling edges. The rising and falling edges of the pulses are clipped using and acousto-optic modulator. A dispersion-compensator compensates for dispersion in the clipped pulses introduced by the AOM. Achromatic focusing optics focus the dispersion-compensated, clipped pulses on the PCB for the via-hole drilling.

16 Claims, 11 Drawing Sheets

(56) References Cited

U.S. PATENT DOCUMENTS

| | | |
|---|---|---|
| 7,453,918 B2 | 11/2008 | Laughman et al. |
| 7,508,850 B2 | 3/2009 | Newman et al. |
| 7,756,186 B2 | 7/2010 | Chenausky et al. |
| 7,817,685 B2 * | 10/2010 | Osako et al. .................... 372/25 |
| 8,050,306 B2 | 11/2011 | Seguin et al. |
| 2004/0222197 A1 | 11/2004 | Hiramatsu |
| 2007/0215575 A1 * | 9/2007 | Gu et al. .......................... 216/59 |
| 2010/0193481 A1 * | 8/2010 | Osako ....................... 219/121.61 |
| 2011/0259860 A1 | 10/2011 | Bass et al. |
| 2013/0154159 A1 | 6/2013 | Noel et al. |
| 2014/0185119 A1 * | 7/2014 | Staver ........................ 359/211.3 |
| 2014/0231085 A1 * | 8/2014 | Zediker et al. ................. 166/288 |

OTHER PUBLICATIONS

Donley et al., "Double-Pass Acousto-Optic Modulator System", Review of Scientific Instruments, vol. 76, 063112, 2005, pp. 063112-1-063112-6.

International Search Report and Written Opinion received for PCT Patent Application No. PCT/US2014/053129, mailed on Mar. 19, 2015, 10 pages.

* cited by examiner

VIA-HOLE DRILLING IN A PRINTED CIRCUIT BOARD USING A CARBON MONOXIDE LASER

TECHNICAL FIELD OF THE INVENTION

The present invention relates in general to laser drilling of via holes in printed circuit boards (PCBs). The invention relates in particular to laser drilling PCBs using long wavelength infrared radiation from a gas discharge laser.

DISCUSSION OF BACKGROUND ART

Sealed off radio-frequency (RF) excited carbon dioxide ($CO_2$) lasers are currently favored for drilling via-holes (via-drilling) in PCBs. These lasers are relatively compact in relation to available output power. By way of example, a laser less than one meter (m) in length can deliver a beam of long-wavelength infrared (IR) radiation at wavelength around 10.6 micrometers ($\mu m$) with an average power of 400 Watts (W) or greater. While $CO_2$ laser via-drilling is fast and efficient, there will be an eventual limit to the smallest hole-size that can be drilled due to the long wavelength of the laser beam. Demands on minimum hole-size and spacing are increasing rapidly for PC boards used in so called "smart phones", which, practically considered, are hand-held portable computer devices with many more functions than simply making and receiving phone calls. In a current state-of the-art smart phone, a PCB may have as many as 30,000 via-holes. As more functions are added to the smart phones, more complex circuitry with more via holes will be required, and, eventually a shorter drilling wavelength will be required to achieve smaller hole-size and closer spacing.

It has been postulated that a preferred via-hole drilling wavelength would be a so-called mid-IR (MIR) wavelength between about 2 $\mu m$ and about 8 $\mu m$. Apart from the potential for smaller hole-size and closer spacing, MIR wavelengths have a higher absorption coefficient in PCB materials than at the longer, $CO_2$ laser radiation wavelengths. This would allow a more rapid absorption of heat into the PCB, which could lead to holes with cleaner walls and less collateral thermal damage in general.

MIR wavelengths could be generated from commercially available near-IR (NIR) emitting, solid-state lasers, fiber-lasers, or optically pumped semiconductor lasers, using sum-frequency generation or optical-parametric generation. This however would require apparatus having many times the cost-per-watt achievable in a $CO_2$ laser system.

Arguably, the only potentially viable candidate MIR laser for replacing a $CO_2$ laser for via-drilling is a CO laser. Recent investigations of sealed off CO-lasers have led to a sealed off CO-laser which is, with only a simple modification, a sealed-off $CO_2$ laser but with a different lasing-gas mixture. A power output of about 80% of that of a corresponding $CO_2$ laser has been achieved.

In via-drilling operations, $CO_2$ lasers are driven in a pulsed mode. A problem with CO lasers is that when driven in a pulsed mode, pulse rise and fall times are relatively long. Long rise and fall times of pulses can create unacceptable collateral thermal damage around laser-drilled via holes. In theory at least, rise and fall times of laser pulses can be shortened by modulation "clipping" of the laser-pulses using an acousto-optic modulator (AOM).

This is complicated, however, by a broad wavelength range of CO laser output. CO laser output occurs at range of laser wavelengths between about 4.5 $\mu m$ and about 6.0 $\mu m$. An AOM functions by virtue of a refractive index grating induced in a susceptible crystal such as a germanium (Ge) crystal by applying a high RF voltage to the crystal. Inducing the grating diverts a laser beam from one path through the crystal with no grating induced, into an alternate path at an angle to the un-diverted (RF applied) path. The angle of the diverted path, of course, is wavelength dependent. With a collimated beam having the full bandwidth of the CO laser, a diverted beam would be spread into a fan of rays which would complicate focusing the beam onto a PCB for drilling.

This beam-spreading by an AOM could be mitigated by limiting the CO laser bandwidth, for example, by using a spectrally selective device such as an etalon or grating within the laser-resonator. The nature of the CO laser, however, is such that output power would be reduced in direct proportion to the degree of spectral-bandwidth reduction. Reducing the spectral bandwidth to proportions compatible with the AOM could reduce the CO laser power to as low as one fifth of that of a comparably sized and pumped $CO_2$ laser. This and related problems must be overcome for a CO laser to become a commercially viable replacement for a $CO_2$ laser for via-drilling.

SUMMARY OF THE INVENTION

In one aspect, apparatus in accordance with the present invention comprises an acousto-optic modulator (AOM) and a carbon monoxide (CO) laser. The CO laser emits laser-radiation pulses, with radiation in the pulses having a plurality of wavelengths in a wavelength range between about 4.5 micrometers and 6.0 micrometers. The radiation pulses having a temporal rising edge and a temporal falling edge. The laser radiation pulses are incident on the AOM in an incidence direction. The AOM is arranged to receive the radiation pulses, disperse a central temporal portion of the pulses, excluding a portion of the rising edge and a portion of the falling edge, in a first range of wavelength-dependent dispersed directions at an angle to the incidence direction. Residual portions of the pulses are transmitted by the AOM along the incidence direction. A dispersion-compensator is arranged to receive the central temporal portion of the pulses and reduce the range of dispersed directions to a second range less than the first range. At least one optical element is arranged to achromatically focus the temporal pulse portions from the dispersion-compensator onto the work-piece.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
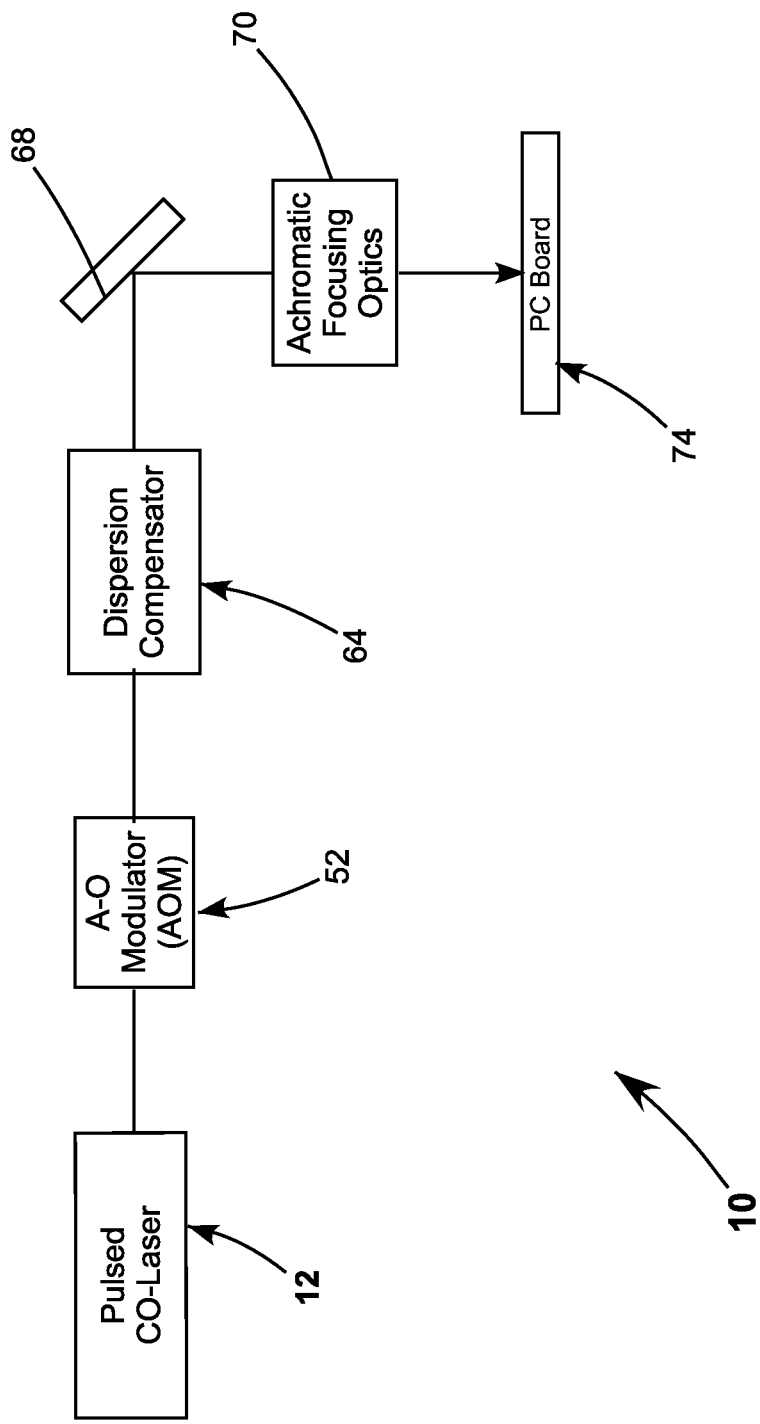
FIG. 1 is a block diagram schematically illustrating via-drilling apparatus in accordance with the present invention including a CO laser of FIG. 1 operated in a pulsed manner, with pulses having a broad wavelength range characteristic of the CO laser, an acousto-optic modulator (AOM), for selecting and clipping pulses emitted by the CO laser, a dispersion-compensator for correcting dispersion introduced in the selected and clipped pulses by the AOM, and achromatic focusing optics for focusing the dispersion corrected pulses onto a printed circuit board (PCB) for via drilling.

Referring now to the drawings, wherein like components are designated by like reference numerals, FIG. 1 schematically illustrates in block diagram form a via-drilling apparatus 10 in accordance with the present invention. Apparatus 10 includes a sealed-off CO laser 12 emitting laser radiation at wavelengths in a range between about 4.5 μm and about 6.0 μm. The laser is operated in a pulsed manner. By way of example, the pulses may have a selected duration between about 100 microseconds (μs) and 160 is at a selected pulse-repetition frequency (PRF) between about 0.5 kilohertz (kHz) and 2.0 (kHz). Such a laser is available from Coherent Inc. of Santa Clara Calif., the assignee of the present invention.

The pulses are characterized by long rise and fall times, and in fact it can be said that the pulses are either rising or falling in amplitude with no significant period of near-constant amplitude within the pulse-duration. By way of example in a pulse having a nominal duration of 140 μs at a PRF of 1.0 kHz, measured rise time was 50 μs, and measured fall time was 84 μs. In order to be useful for the inventive CO laser via-drilling, these pulses must be clipped in both the rising and falling edges. An acousto-optic modulator (AOM) 52 is provided for selecting pulses from the laser output and for effecting the rising edge and falling edge clipping of the selected pulses.

An AOM functions by diverting radiation from an input path using a "refractive index grating" induced in a germanium crystal by application of a high RF-voltage to the crystal. In the case of the CO laser pulses with such broad bandwidth, this introduces dispersion in a diverted (selected and clipped) pulse-beam. This dispersion is corrected in apparatus 10 by a dispersion-compensator 64. A turning mirror 68 directs the dispersion-compensated pulse-beam to achromatic focusing optics 70. The achromatic focusing optics focus the dispersion-compensated pulse-beam onto a PCB 74 for via drilling.

Figure 2:
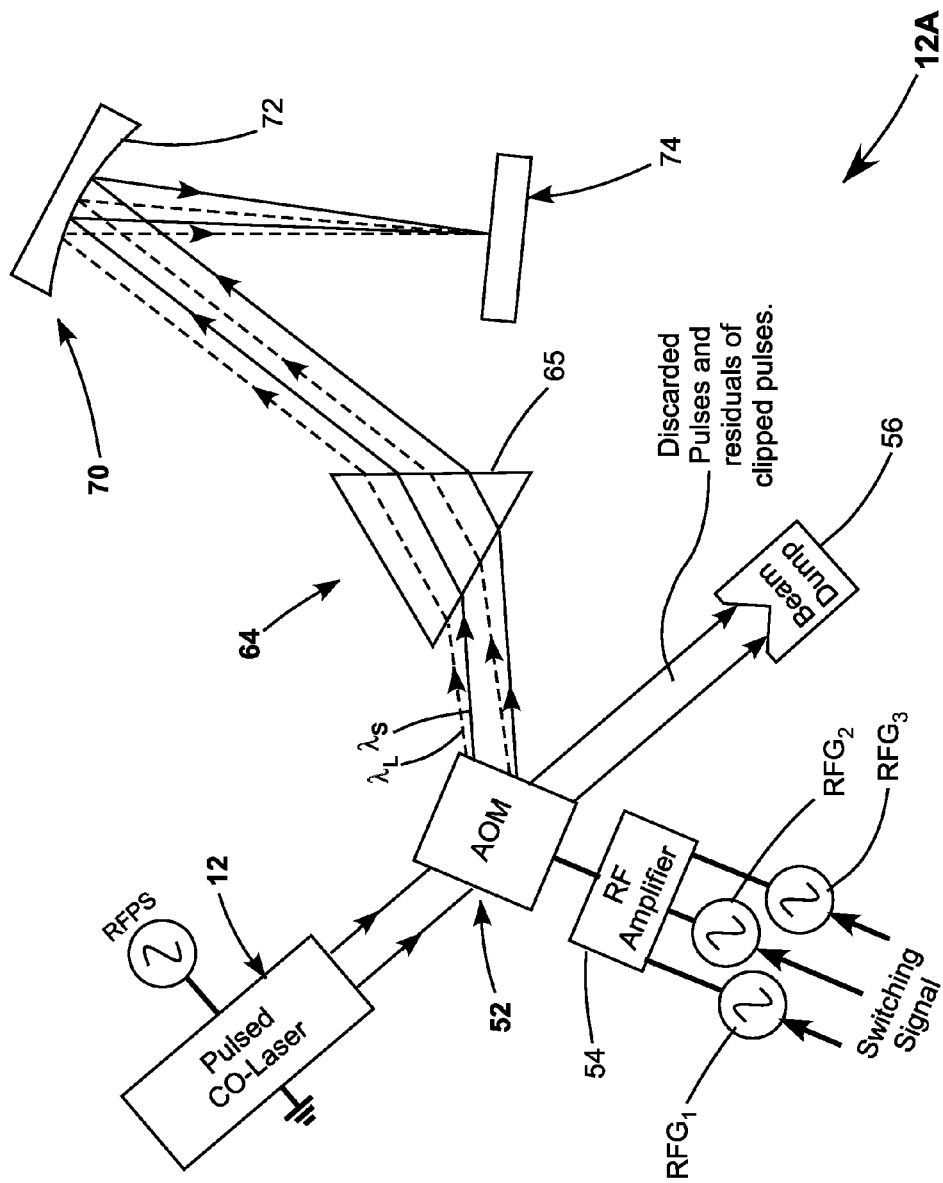
FIG. 2 schematically illustrates a preferred embodiment of the apparatus of FIG. 1, wherein the dispersion-compensator is a prism, and the achromatic focusing optics include a concave mirror and the AOM is driven by a plurality of sequentially switched RF-generators.

FIG. 2 schematically illustrates a preferred embodiment 12A of the apparatus of FIG. 1. Here, a pulse-beam diverted and clipped by AOM 52 is diverted into a fan of rays, with the shortest wavelength ($\lambda_S$) in the pulse-spectrum being diverted at a lesser angle than the longest wavelength ($\lambda_L$) in the pulse-spectrum. The shortest wavelength and longest wavelength rays as depicted in the drawing by respectively solid and dashed lines. The AOM, here, is driven by a RF amplifier 54 fed by RF generators $RFG_1$, $RFG_2$ and $RFG_3$.

Pulses not selected and discarded portions of selected pulses proceed un-diverted to a beam-dump 56. The discarded portions of the pulses include the "clipped-off" rising-edge and falling-edge portions the pulses and some portion of the diverted pulse beam resulting from less than 100% efficient diffraction by the AOM.

Dispersion-compensator 64 in apparatus 12A is a prism 65 configured and arranged to about collimate the fan of rays from the AOM. The term "about collimated" as used here in the appended claims means that it is not necessary that the dispersion-compensated rays are exactly collimated and can be in some reduced range of directions.

Prism 65 directs the about-collimated beam to achromatic focusing optics 70 which in embodiment 12A is a concave mirror 72. Mirror 702 focuses the about-collimated beam onto PCB 74. Those skilled in the art will recognize, without further detailed description or illustration, that a more complex focusing arrangement having more than one element may be used without departing from the spirit and scope of the present invention. Such focusing arrangements may comprise only reflective elements (mirrors), only transmissive elements (lens elements), or some combination of reflective and transmissive elements.

Figure 2A:
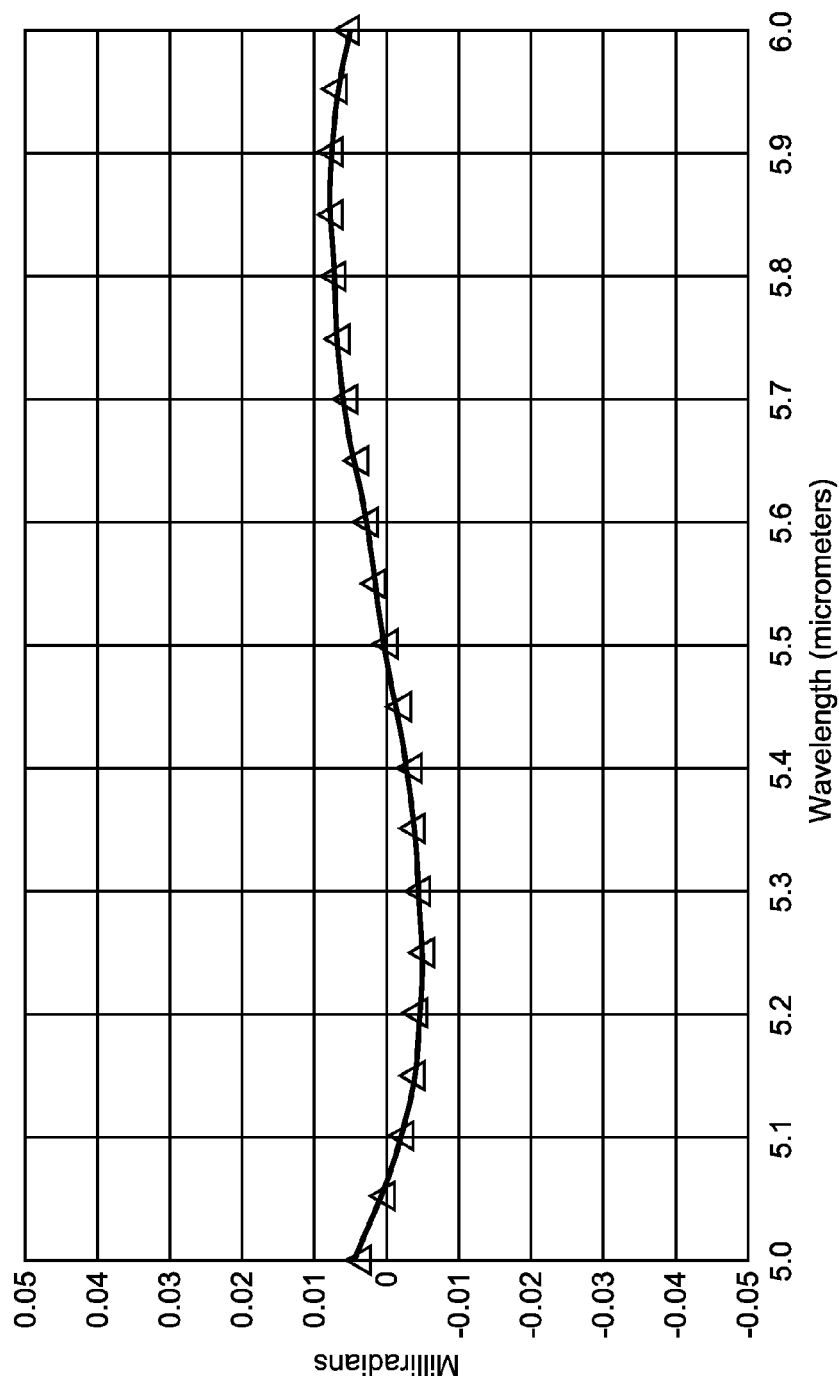
FIG. 2A is a graph schematically illustrating an example of dispersion-compensation as a function of wavelength in the apparatus of FIG. 2 wherein the AOM is a germanium-crystal AOM and the prism is a zinc sulfide prism.

FIG. 2A is a graph schematically illustrating calculated dispersion-compensation as a function of wavelength for the prism arrangement of FIG. 1. In this case the AOM is a germanium (Ge) AOM and the prism is a zinc sulfide (ZnS) prism. Dispersion-compensation (in milliradians) is the difference between dispersion produced by the AOM and dispersion produced by the prism. It can be seen that at wavelengths between 5.0 μm and 6.0 μm, net dispersion is less than 20 microradians.

Figure 3A:
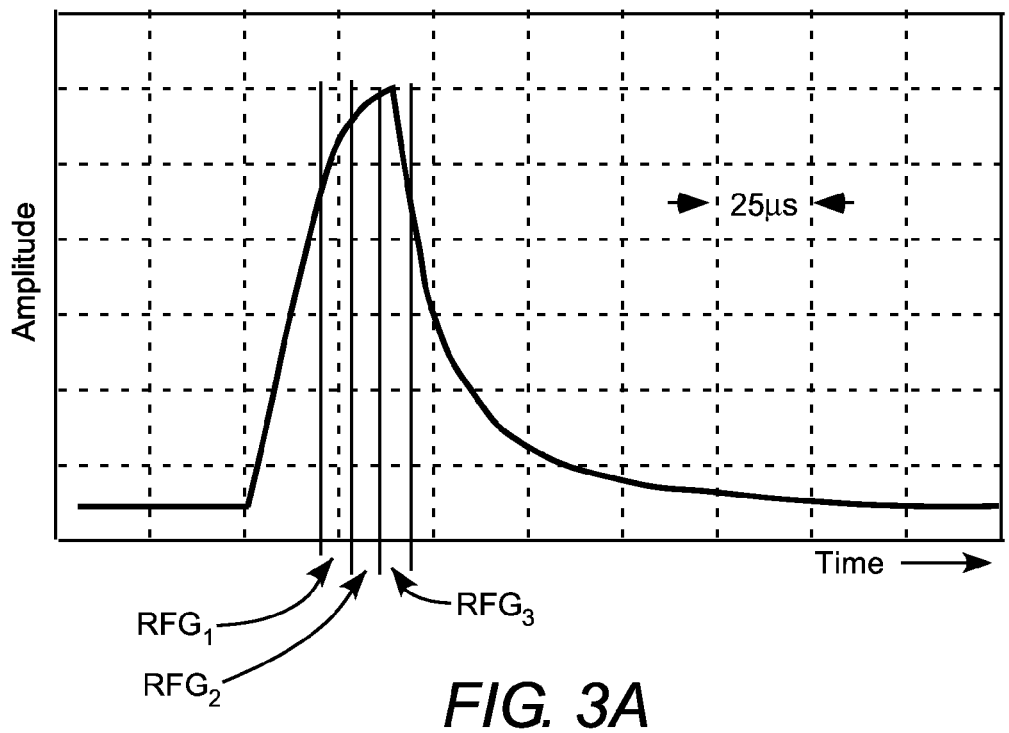
FIG. 3A and FIG. 3B are graphs schematically illustrating a sequential switching scheme for the RF-generators of FIG. 2.
Figure 3B:
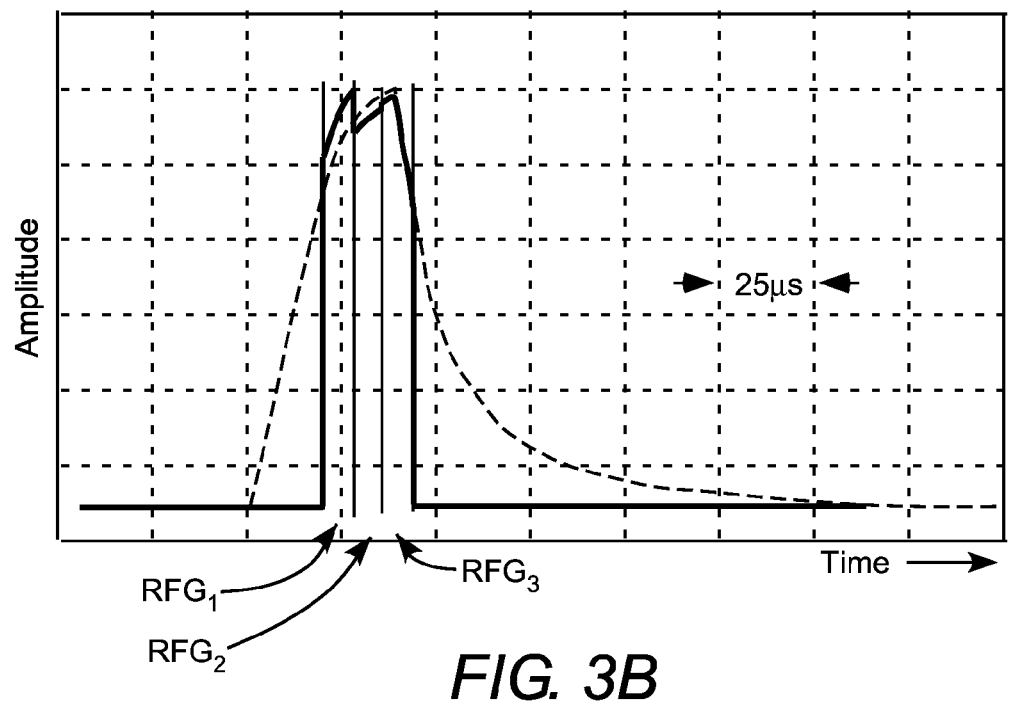

Continuing with reference to FIG. 2, and with reference in addition to FIG. 3A and FIG. 3B, in apparatus 10A, as noted above, AOM 52 is driven by RF amplifier 54 which can be driven, in turn, by any one of the three RF-generators $RFG_1$, $RFG_2$ and $RFG_3$. Each of the RF-generators has the same frequency but has selectively variable output amplitude. The purpose of this plural-generator driving arrangement is to be able to "clip" a pulse using a plurality of time sequenced "slices". Each of the RF-generators clips one slice. The selectively variable amplitude of the RF-generator amplitude (and a corresponding selectively variable efficiency of the induced refractive index grating in the AOM) allows the amplitude of the individual slice to be selectively varied.

FIG. 3A is a reproduction of an oscilloscope trace depicting a pulse (solid bold curve) to be sliced. The parallel, vertical, fine solid lines depict the "on" and "off" times of the RF-generators $RFG_1$, $RFG_2$ and $RFG_3$, in time-sequence. There will, of course, need to be a very small time interval (not visible in FIG. 4A) between switching one RF-generator "off" and switching the next RF-generator "on".

FIG. 3B depicts how an oscilloscope trace (solid bold curve) comparable to that reproduced in FIG. 3A would appear with "slicing" according to the time-sequence of FIG. 3A, but wherein the amplitude of the $RFG_1$-slice is greater than the amplitude of the $RFG_3$-slice, which, in turn, is greater than the amplitude of the $RFG_2$-slice. In the example of FIG. 3B the RF generator amplitudes have been selected such that peak power in each pulse slice is about equal.

It should be noted here that the RF generators can also be operated at different frequencies in which case the three pulse "slices would leave the AOM at different angles and could be used separately, by separate focusing optics for via drilling. This is discussed in more detail further hereinbelow.

Figure 4:
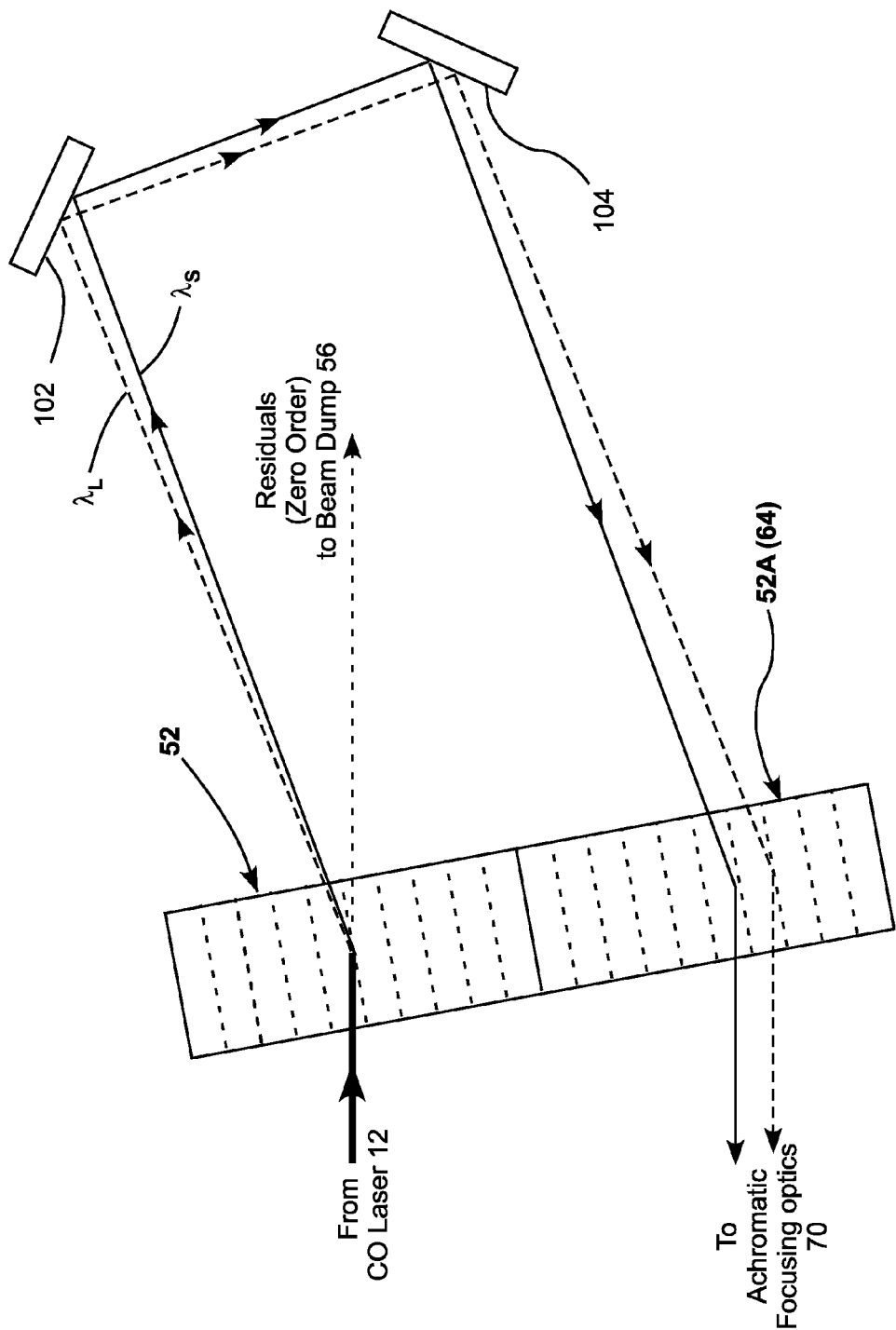
FIG. 4 schematically illustrates one dispersion-compensation arrangement where an AOM is used in a double-pass mode for pulse-clipping and also for dispersion-compensation of the clipped pulses.

FIG. 4 schematically illustrates one alternative dispersion-compensating arrangement which can be used in apparatus in accordance with the present invention. In this arrangement, a portion 52A of AOM 52 acts as dispersion-compensator 64. Here, a pulse beam from CO laser 12 (depicted by a bold solid line) is clipped by AOM 52 in an upper portion thereof. A grid of dotted lines schematically illustrates the refractive index grid induced by application of RF power to the AOM.

The clipped pulse beam is diffracted into a narrow fan of rays bounded by a longest $\lambda_L$ (dashed lines) and a shortest $\lambda_S$ (solid lines). Turning mirrors 102 and 104 in a retro-reflecting arrangement direct the pulse-beam back to a lower portion 52A of the AOM with incident angles of $\lambda_L$ and $\lambda_S$ in the pulse-beam on portion 52A corresponding to the diffracted angles from AOM 52. On the second passage through the AOM dispersion is compensated and the $\lambda_L$ and $\lambda_S$ rays propagate parallel to each other to the achromatic focusing optics. Unclipped radiation and residuals of clipped radiation proceed in the zero-order direction to beam-dump 56, as schematically illustrated in the drawing.

The path length from the AOM back to the AOM is made sufficiently long that the entire laser pulse can traverse the AOM, before the AOM is reactivated, by application of RF power, for providing the dispersion-compensation. This temporally separates the pulse-clipping and dispersion-compensating functions of the AOM.

Figure 5:
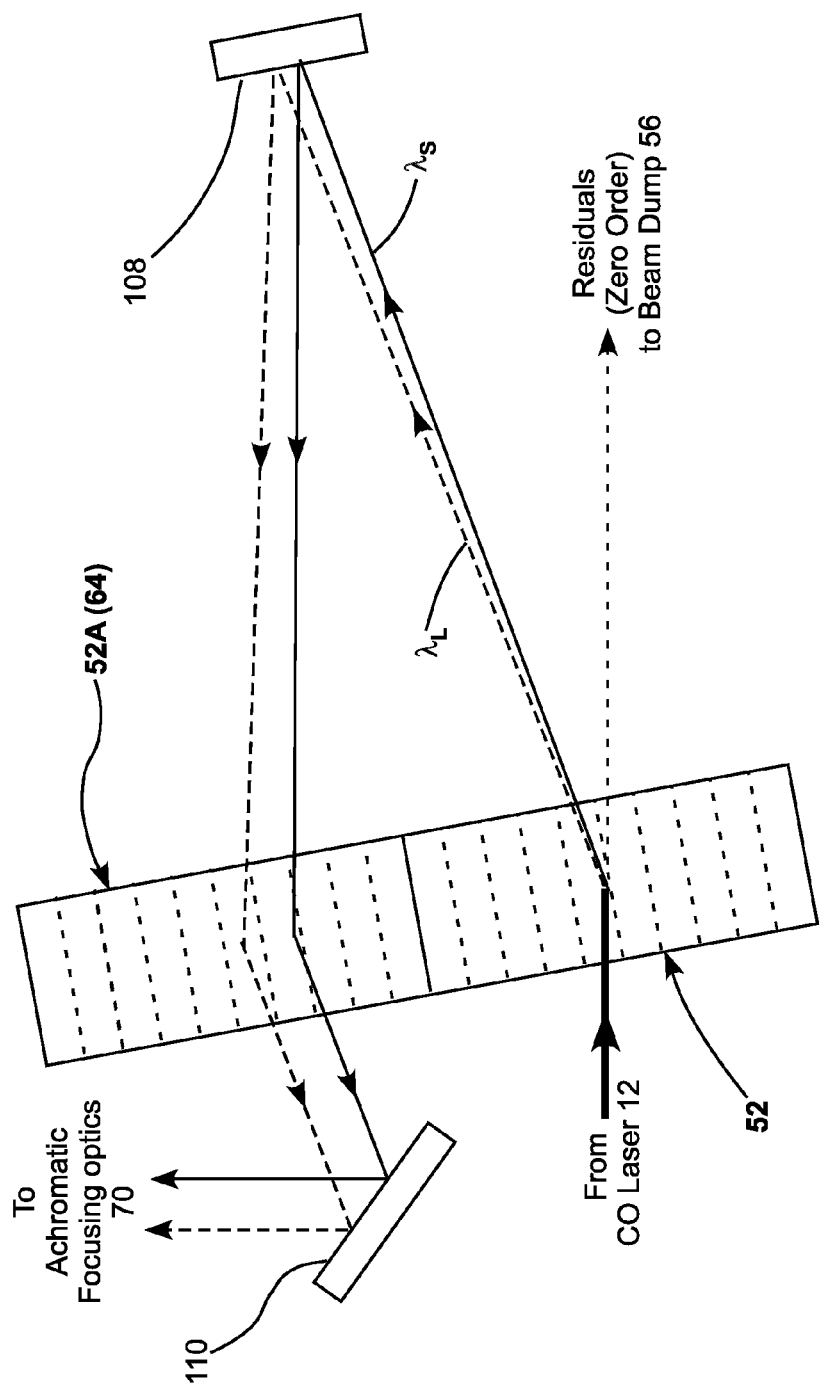
FIG. 5 schematically illustrates another dispersion-compensation arrangement where an AOM is used in a double-pass mode for pulse-clipping and also for dispersion-compensation of the clipped pulses.

FIG. 5 schematically illustrates another alternative dispersion-compensating arrangement which can be used in apparatus in accordance with the present invention. This arrangement is similar to the arrangement of FIG. 4 with an exception that only one turning-mirror 108 directs the clipped pulse-beam back to portion 52A of AOM 52. As in the arrangement of FIG. 4 the diffracted from, and re-incident angles on the AOM of $\lambda_L$ and $\lambda_S$ rays are the same The dispersion-compensated pulse-beam is directed by turning-minor 110 to the achromatic focusing optics.

Figure 6:
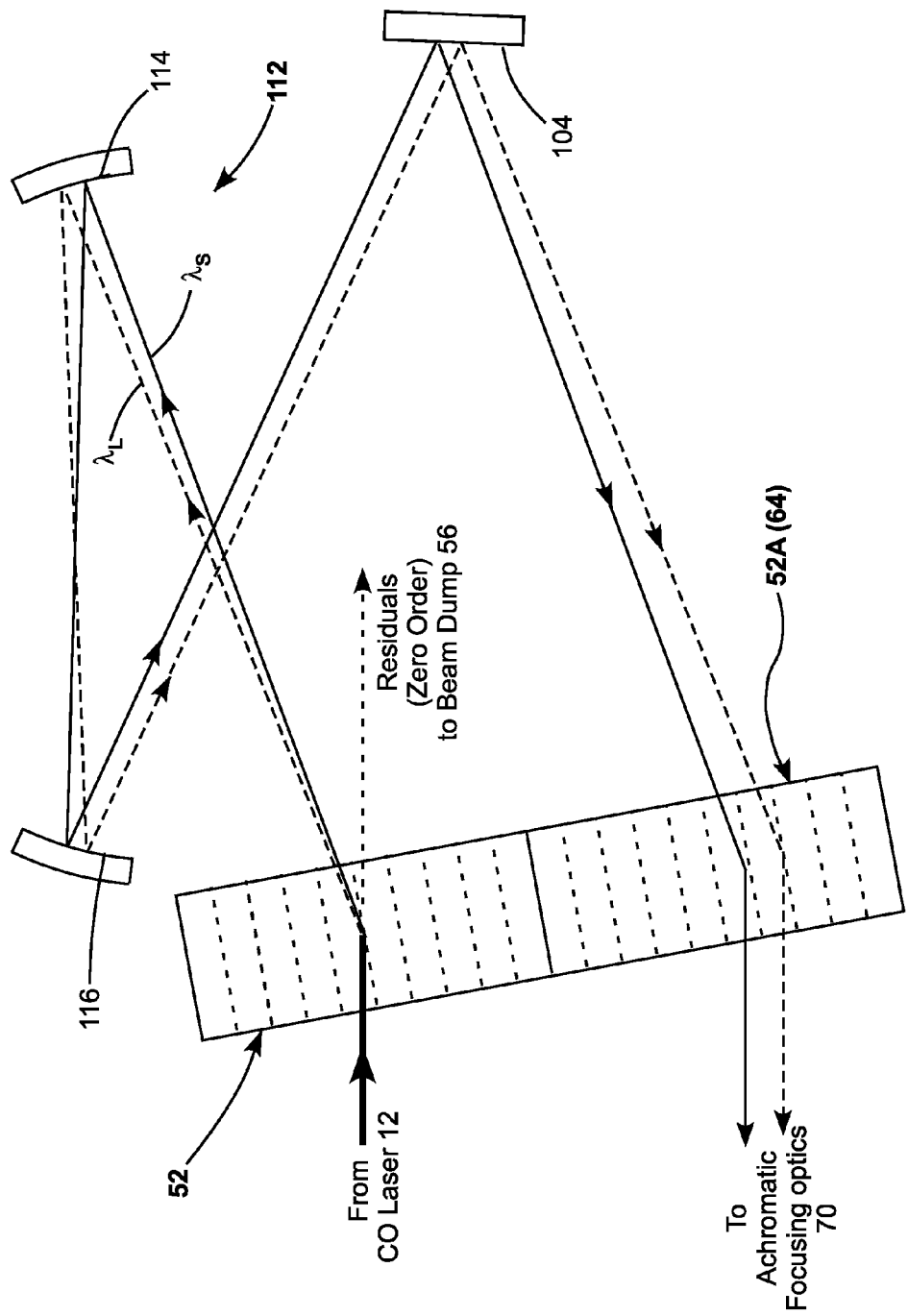
FIG. 6 schematically illustrates yet another dispersion-compensation arrangement where an AOM is used in a double-pass mode for pulse-clipping and also for dispersion-compensation of the clipped pulses.

FIG. 6 schematically illustrates yet another alternative dispersion-compensating arrangement which can be used in apparatus in accordance with the present invention. This arrangement is similar to the arrangement of FIG. 4 with an exception that the beam path from the AOM back to the AOM is extended by an f-2f-f relay telescope 112, formed by concave minors 114 (where f is the focal length of the concave mirrors). The beam at a distance f from minor 114 is imaged at a distance f from mirror 116. This reduces spreading of the beam.

Figure 7:
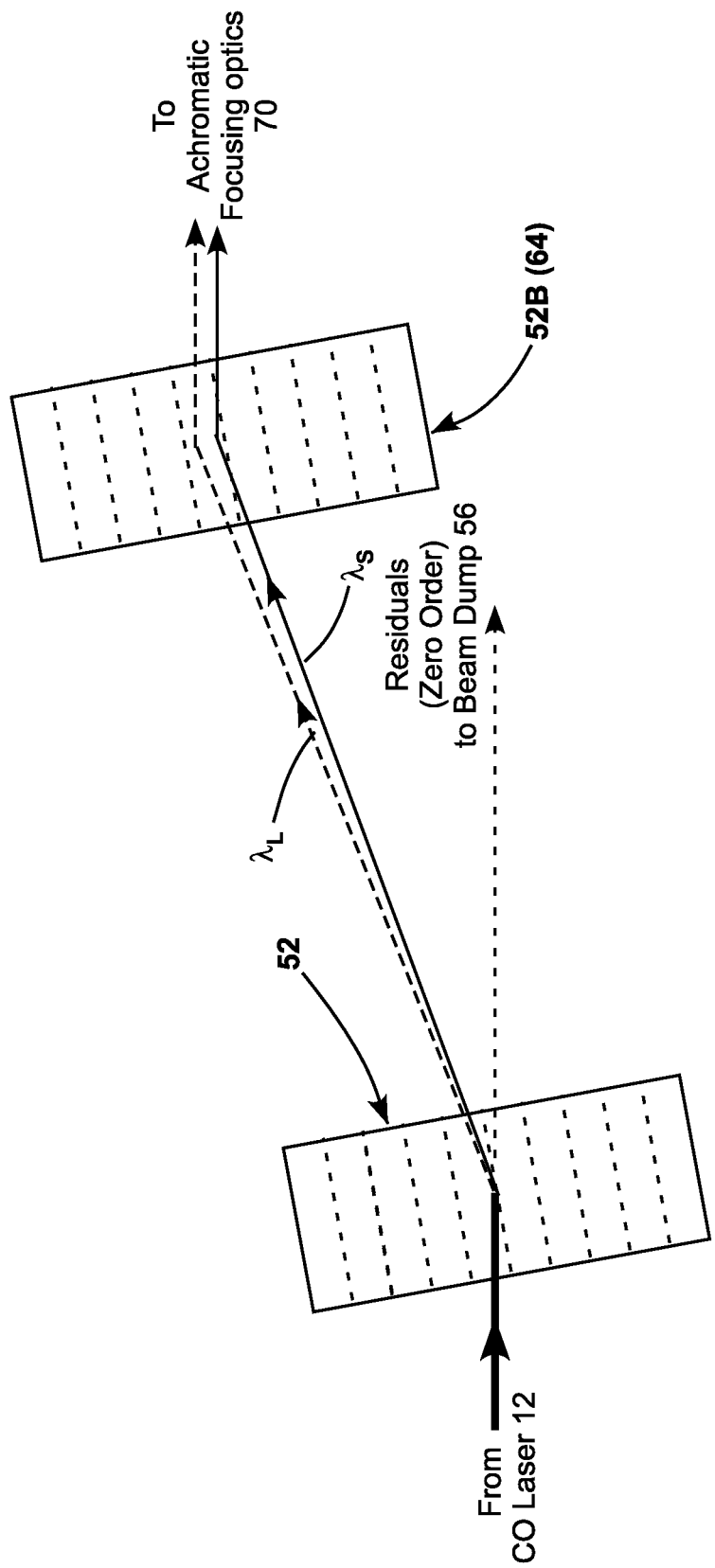
FIG. 7 schematically illustrates a dispersion-compensation arrangement wherein one AOM is used for pulse clipping and another AOM is used for dispersion-compensation of the clipped pulses.

FIG. 7 schematically illustrates still another alternative dispersion-compensating arrangement which can be used in apparatus in accordance with the present invention. This arrangement is similar to the arrangement of FIG. 2 with an exception that a separate AOM 52B is substituted for the dispersion-compensation prism of the arrangement of FIG. 2. As AOM 52 and AOM 52B can be operated independently, there is no need for an extended optical path between the AOMs and beam spreading can be accordingly limited.

Figure 8:
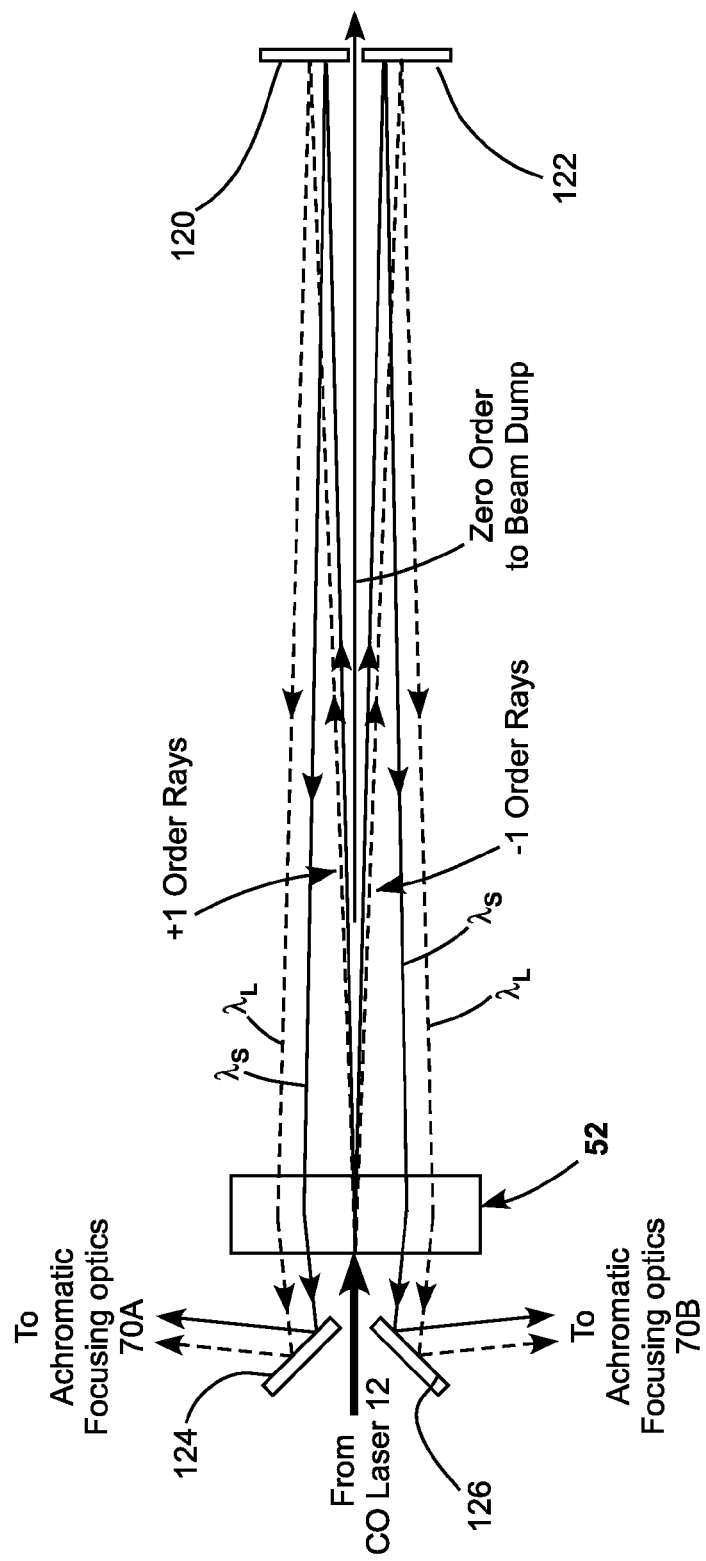
FIG. 8 schematically illustrates a dispersion-compensation arrangement similar to the arrangement of FIG. 5, but wherein plus and minus diffraction orders of the AOM produce two clipped pulses for every pulse incident on the AOM.

In all of the above-described dispersion-compensating arrangements only one diffraction-order of AOM 52 is used for pulse-clipping. FIG. 8 schematically illustrates an arrangement in which the +1 order and −1 order are used to provide, simultaneously, two clipped pulses from each pulse from CO laser 12 incident on AOM 52. Turning minors 120 and 122 return the two clipped pulses to the AOM for dispersion-compensation, as in the dispersion-compensation arrangement of FIG. 5. The dispersion-compensated clipped pulses are directed to separate achromatic focusing optics 70A and 70B (not explicitly shown) by turning-minors 124 and 126, respectively.

Figure 9:
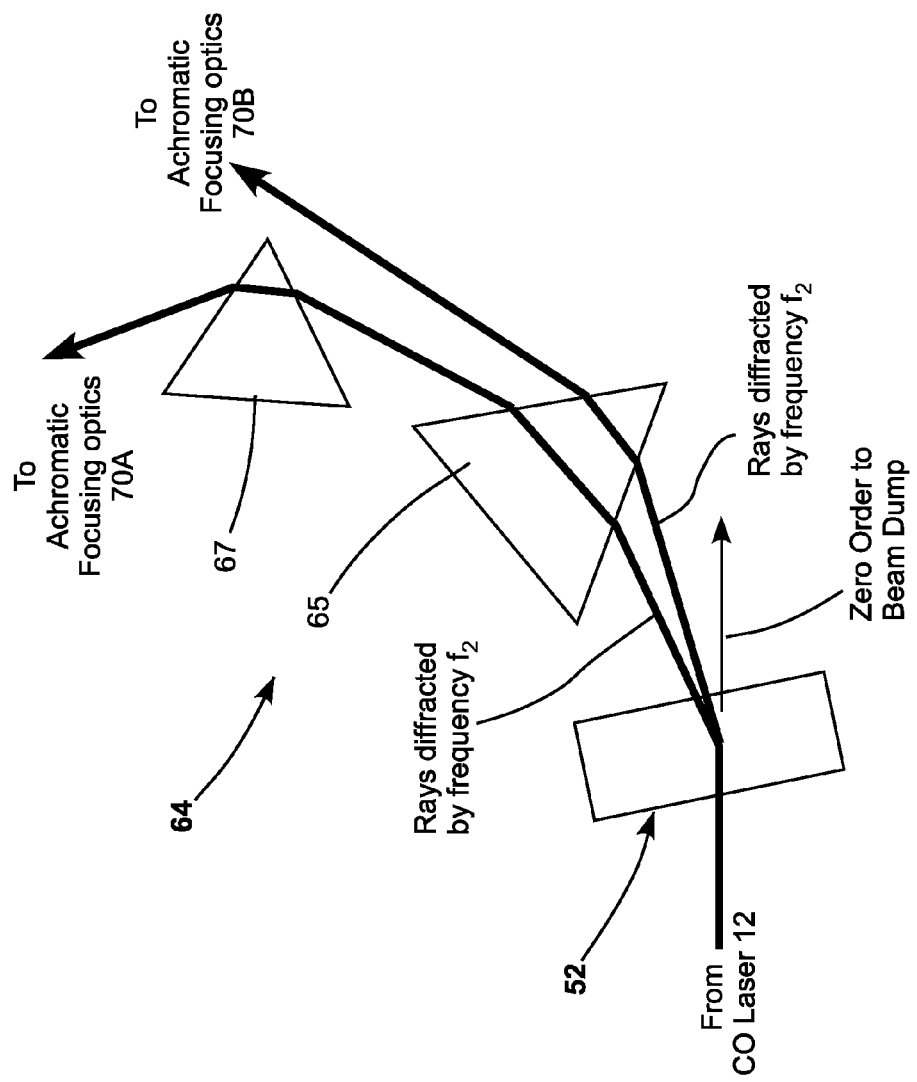
FIG. 9 schematically illustrates a dispersion-compensation arrangement wherein the AOM is sequentially driven at two different frequencies to provide two clipped pulses diffracted at different angle from every pulse incident on the AOM, with one prism providing dispersion-compensation for one of the clipped pulses and two prisms providing dispersion-compensation for the other of the clipped pulses.

Another dispersion-compensation arrangement used in conjunction with providing two clipped pulses from one incident pulse is depicted in FIG. 9. Here AOM 52 is driven sequentially by two different RF frequencies $f_1$ and $f_2$. In the drawing of FIG. 9 the clipped pulse beams are shown by a single bold line for convenience of illustration. These beams include the diffracted ray-fans described above and depicted in other drawings. In the drawing of FIG. 9, $f_2$ is assumed to be greater than $f_1$ such that the $f_2$ clipped-pulse rays are diffracted at a greater angle than the F1 clipped-pulse rays.

In the arrangement of FIG. 9, dispersion-compensation is provided by prism 65 and 67. Dispersion introduced by $f_2$ is assumed to be greater than can be compensated by a single prism. The $f_2$ rays traverse both prisms to provide the compensation. Dispersion introduced by $f_1$ is sufficiently small that only prism 65 is need to provide dispersion-compensation. The $f_2$ and $f_1$ clipped pulses are sent to separate focusing optics as described above with reference to FIG. 8.

Figure 10:
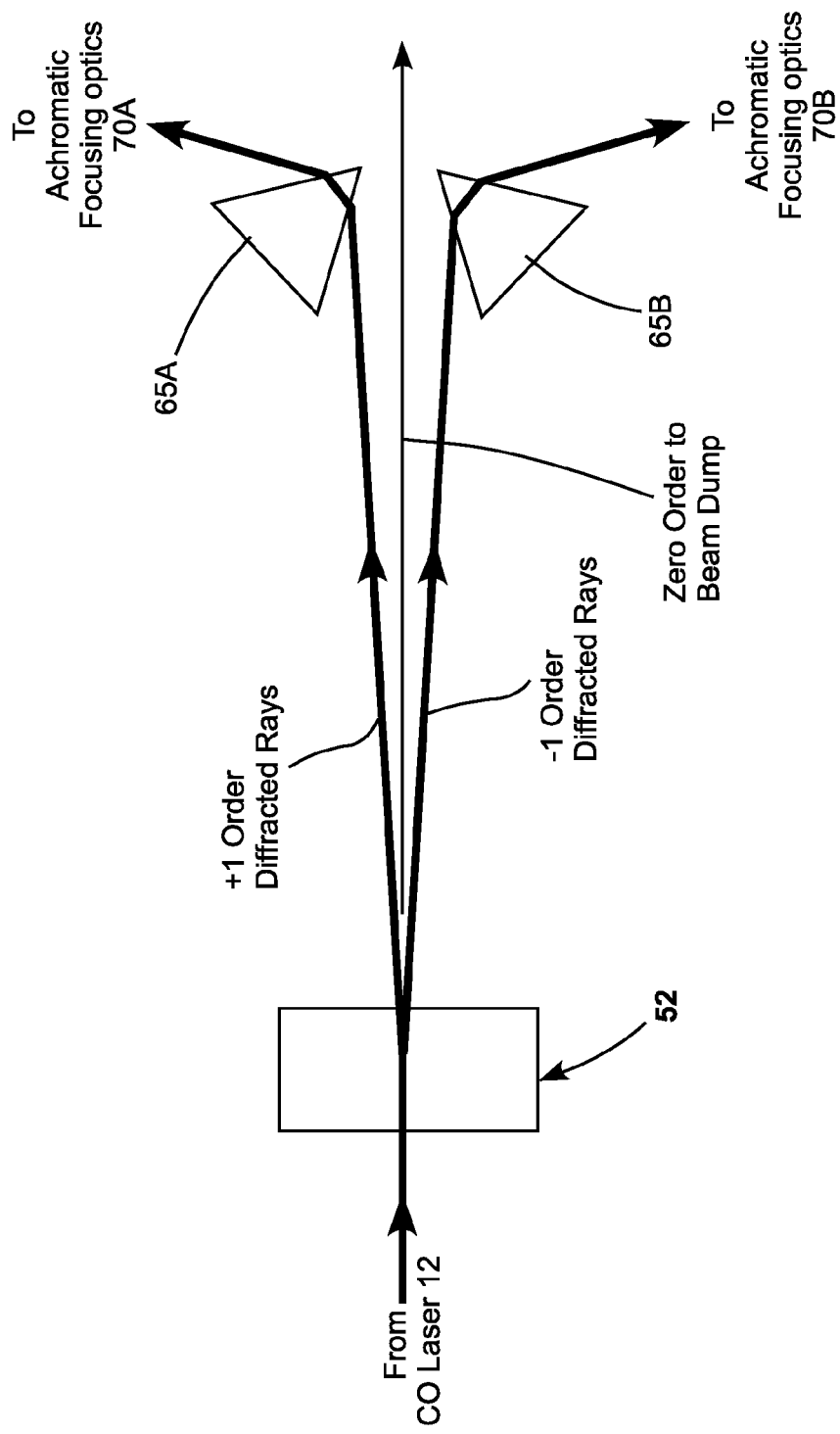
FIG. 10 schematically illustrates a dispersion-compensation arrangement similar to the arrangement of FIG. 8, but wherein each of the two clipped is dispersion-compensated by a corresponding prism.

FIG. 10 schematically illustrates a dispersion-compensation similar to the arrangement of FIG. 8 wherein AOM 52 provides simultaneously, two clipped pulses for a single incident pulse, by using the +1 diffracted order and the −1 diffracted order. The diffracted beams are depicted by single bold lines, for convenience of illustration, as in the arrangement of FIG. 9. In the arrangement of FIG. 10, the diffracted beams are separately dispersion-compensated by prisms 65A and 65B, which direct the dispersion-compensated beams to achromatic focusing optics 70A and 70B (not explicitly shown), respectively.

The present invention is described above in terms of a preferred and other embodiments. The invention is not limited, however, to the embodiments described and depicted herein. Rather the invention is limited only by the claims appended hereto.

What is claimed is:
1. Apparatus for laser-drilling a work-piece, comprising:
a first acousto-optic modulator (AOM);
a carbon monoxide (CO) laser emitting laser-radiation pulses with radiation in the pulses having a plurality of wavelengths in a wavelength range between about 4.5 micrometers and about 6.0 micrometers, the radiation pulses having a temporal rising edge and a temporal falling edge and the laser radiation pulses being incident on the AOM in an incidence direction;
the AOM being arranged to receive the radiation pulses, disperse a central temporal portion of the pulses, excluding a portion of the rising edge and a portion of the falling edge, in a first range of wavelength-dependent dispersed directions at an angle to the incidence direction, and transmit residual portions of the pulses along the incidence direction;

a dispersion-compensator arranged to receive the central temporal portion of the pulses and reduce the range of dispersed directions to a second range less than the first range; and at least one optical element arranged to achromatically focus the temporal pulse portions from the dispersion-compensator onto the work-piece.

2. The apparatus of claim 1, wherein the dispersion compensator includes at least one prism.

3. The apparatus of claim 2, wherein the dispersion compensator includes two prisms.

4. The apparatus of claim 2, wherein the prism is a zinc sulfide prism.

5. The apparatus of claim 1, wherein the dispersion compensator is a second AOM.

6. The apparatus of claim 1, wherein the a central temporal portion of the pulses are dispersed by a first portion of the first AOM, the dispersion compensator is a second portion of the first AOM, and the apparatus further includes at least one reflective optical element arranged to steer the dispersed temporal central portion of the pulses around an optical path into the second portion of the first AOM.

7. The apparatus of claim 6, wherein the at least one reflective optical element is a plane reflective optical element.

8. The apparatus of claim 6, wherein the length of the optical path between the first and second portions of the first AOM is sufficient that the dispersed central portion of a pulse arrives at the second portion of the first AOM after the entire pulse has traversed the first portion of the first AOM.

9. The apparatus of claim 6, wherein the apparatus includes two plane reflective optical elements arranged to steer the dispersed temporal central portion of the pulses around the optical path into the second portion of the first AOM.

10. The apparatus of claim 6, wherein the apparatus includes a plane reflective optical element and first and second concave reflective optical elements arranged to steer the dispersed temporal central portion of the pulses around the optical path into the second portion of the first AOM.

11. The apparatus of claim 10, wherein the first and second concave reflective optical elements have the same focal length are arranged face to face and spaced apart by twice the focal length.

12. The apparatus of claim 11, wherein the dispersed central portion of the pulses is reflected from the first concave reflective optical element to the second concave reflective optical element, from the second concave reflective optical element to the plane reflective optical element, and from the plane reflective optical element to the second portion of the first AOM.

13. The apparatus of claim 1, wherein the at least one focusing optical element is a concave mirror.

14. The apparatus of claim 1, wherein the second range of directions is about parallel.

15. Apparatus for laser-drilling a work-piece, comprising:

a first acousto-optic modulator (AOM) sequentially operated by at least first and second RF signals having the same frequency but different magnitude;

a carbon monoxide (CO) laser emitting laser-radiation pulses with radiation in the pulses having a plurality of wavelengths in a wavelength range between about 4.5 micrometers and about 6.0 micrometers, the radiation pulses having a temporal rising edge and a temporal falling edge and the laser radiation pulses being incident on the AOM in an incidence direction;

the AOM being arranged to receive the radiation pulses, disperse first and second central temporal portions of the pulses excluding a portion of the rising edge and a portion of the falling edge through application to the AOM of the first and second FR signals, with the first and second temporal portions being dispersed in a first range of wavelength-dependent dispersed directions at an angle to the incidence direction, the first and second magnitudes of the RF signals being selected such that the peak power of the first and second temporally adjacent central temporal portions is about equal;

a dispersion-compensator arranged to receive the central temporal portions of the pulses and reduce the range of dispersed directions to a second range less than the first range; and at least one optical element arranged to achromatically focus the temporal pulse portions from the dispersion-compensator onto the work-piece.

16. The apparatus of claim 15, wherein the first and second RF signals are provided by a RF amplifier seeded by respectively first and second RF generators.

* * * * *